United States Patent [19]

Wong

[11] Patent Number: 5,151,767
[45] Date of Patent: Sep. 29, 1992

[54] POWER INTEGRATED CIRCUIT HAVING REVERSE-VOLTAGE PROTECTION

[75] Inventor: Stephen L. Wong, Scarsdale, N.Y.

[73] Assignee: North American Philips Corp., New York, N.Y.

[21] Appl. No.: 695,490

[22] Filed: May 3, 1991

[51] Int. Cl.⁵ ............................................. H01L 27/02
[52] U.S. Cl. ........................................ 357/43; 357/48; 357/40; 357/23.13
[58] Field of Search ............... 357/43, 42, 48, 23.1, 357/34, 47, 40, 23.4, 23.8, 23.13

[56] References Cited

U.S. PATENT DOCUMENTS

| | | | |
|---|---|---|---|
| 4,426,658 | 1/1984 | Gontowski | 357/48 |
| 4,857,985 | 8/1989 | Miller | 357/48 |
| 4,862,233 | 8/1989 | Matsushita et al. | 357/42 |
| 4,980,746 | 12/1990 | Harrington, III | 357/48 |
| 5,045,909 | 9/1991 | Lucek et al. | 357/34 |

Primary Examiner—William Mintel
Assistant Examiner—Roy Potter
Attorney, Agent, or Firm—Steven R. Biren

[57] ABSTRACT

In power integrated circuits having both control circuit components and at least one power device, the circuit components are typically isolated from the power device by placing them in separate "wells" of opposite conductivity type to that of the underlying substrate. However, when these power integrated circuits are used in applications (such as automotive electronics) where supply voltage can be inadvertently reversed, large and potentially damaging currents can flow through the circuit components. In order to prevent such large reverse currents from flowing, an additional p-n junction is incorporated within the circuit "well", thus preventing undesirably large reverse current flow. However, introduction of this addition p-n junction creates a vertical transistor within the device, thus creating another potentially damaging current path and also creating potential reverse breakdown voltage problems. In order to alleviate these problems, a reverse voltage protection circuit employing two series-connected MOS switching transistors is used to shunt current away from the base of the vertical transistor. Additionally, the effectiveness of this reverse voltage protection circuit can be improved by the addition of an integrated bias circuit that serves to generate a gate bias voltage that further enhances the breakdown characteristics of the circuit.

6 Claims, 3 Drawing Sheets

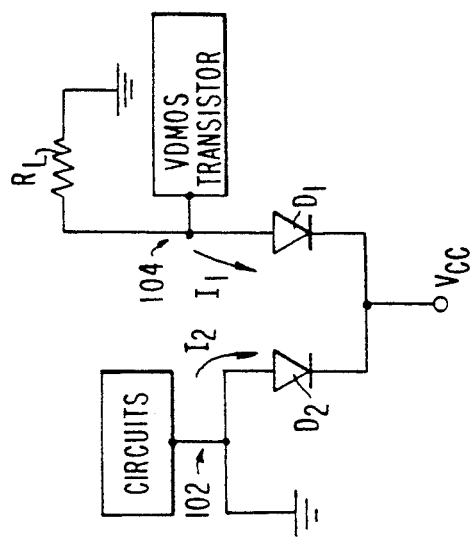
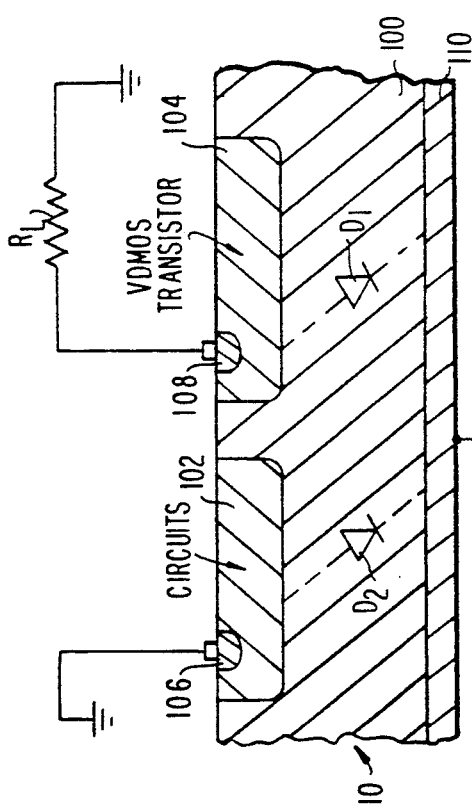
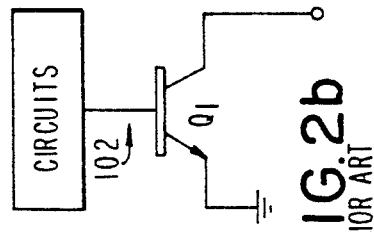
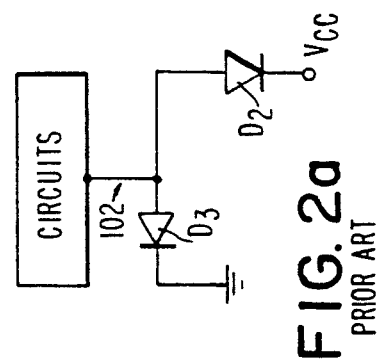

1

POWER INTEGRATED CIRCUIT HAVING REVERSE-VOLTAGE PROTECTION

BACKGROUND OF THE INVENTION

The invention is in the field of power integrated circuit (PIC) devices, and relates specifically to techniques for providing reverse-voltage protection for such circuits.

As noted in "Reverse-Voltage Protection Methods for CMOS Circuits", IEEE Journal of Solid-State Circuits, Vol. 24, No. 1, February, 1989, it is known to introduce an n+ diffusion into a p-type well in order to create a p-n junction with the appropriate polarity to block excessive current when a reverse-polarity voltage is applied to an integrated circuit. However, it is noted in that publication that this approach has the disadvantage that the additional n diffusion forms the emitter of a parasitic vertical bipolar transistor, thus resulting in functional problems during normal operation. For this reason, this approach to the reverse-voltage protection problem was indicated to have been dropped. Various other prior-art reverse-voltage protection circuits, taking different approaches to the problem, are shown in U.S. Pat. No. 4,857,985 and European Patent Application No. 0360991.

Another approach to reverse-voltage protection, as discussed in the previously-cited IEEE publication, is to diffuse a region into the substrate to form the desired p-n blocking junction. However, this approach also introduces an undesirable parasitic transistor, and in any case this technique cannot be used in VDMOS power integrated circuits because the substrate in such circuits is typically tied to the maximum supply voltage.

Yet another known technique for providing reverse-voltage protection is to provide the blocking p-n junction as an external diode, but this approach is clearly undesirable as it requires an extra external component, with the attendant disadvantages of extra cost, space and complexity.

A final drawback of existing reverse-voltage protection circuits is that such circuits are not ideally adapted to high power, moderately high voltage operating conditions, such as those typically encountered in automotive operation, where the PIC must survive a reverse voltage of at least 12 volts and operate under forward voltage conditions as high as 35 volts.

SUMMARY OF THE INVENTION

It is therefore an object of the present invention to provide a power integrated circuit with a reverse-voltage protection circuit which is fully integrated, which avoids undesirable parasitic-transistor effects, and which can be simply and effectively implemented using conventional technology.

It is a further object of the invention to provide a reverse-voltage protection circuit capable of operating in a high-power and moderately high voltage environment without breakdown.

In accordance with the invention, these objects are achieved by providing a power integrated circuit with a reverse voltage protection circuit in which reverse voltage protection is provided by an integrated p-n junction, and in which the undesirable effects of the vertical parasitic transistor created by this junction are minimized by a pair of MOS transistors connected in such a manner as to actively shunt current away from the base of the parasitic transistor, thus minimizing its affect on circuit operation.

For operation at relatively high power and moderate voltage levels, the reverse-voltage protection circuit of the invention may further include a bias-voltage generating circuit which enables the reverse-voltage protection circuit to operate at higher voltage levels than would otherwise be possible without incurring breakdown.

The reverse-voltage protection circuit is implemented in a power integrated circuit having a substrate of a first conductivity type, a first, surface-adjoining well of a second conductivity type opposite to the first, with at least one low-power circuit being provided in the first well. A second, surface-adjoining well of the second conductivity type is provided in the substrate and spaced apart from the first well, with at least one power transistor such as a VDMOS transistor being provided in the second well. Other types of power transistors that can be used in the PIC include bipolar transistors, LDMOS transistors and IGBT devices. Depending upon the particular type of power transistor used, the power transistor may be provided either fully or partly in the second well, in accordance with well-known prior-art techniques.

The reverse-voltage protection circuit includes a p-n junction for coupling the first well to a first power supply terminal, with the p-n junction and a further p-n junction between the first well and the substrate together forming a bipolar transistor (the vertical parasitic transistor mentioned above) having a base region and two main regions defining a major current path, with the substrate being coupled to a second power supply terminal. The reverse-voltage protection circuit also includes a first MOS transistor having a main current path coupled between the base region and a first of the two main regions of the bipolar transistor and a gate terminal coupled to the second supply terminal, and a second MOS transistor having a main current path coupled between the base region and a second of the two main regions of the bipolar transistor and a gate terminal coupled to the first power supply terminal.

The bias-voltage generating circuit for the reverse-voltage protection circuit may be fabricated in a third surface-adjoining well of the second conductivity type which is spaced apart from the first and second wells. The bias-voltage generating circuit includes a third MOS transistor, a fourth MOS transistor, a resistor, and a zener diode, with first and second regions of the first conductivity type in the third well for coupling the third well to the first and second power supply terminals. The first region, the third well and the substrate together form a further bipolar transistor, with the third well forming the base region of this further bipolar transistor. The resistor is coupled from the second power supply terminal to a bias voltage terminal, and the zener diode is coupled from the bias voltage terminal to the third well, with the third MOS transistor having a gate terminal and a main current path coupled between the third well and the first power supply. The fourth MOS transistor has a gate terminal and a main current path coupled between the third well and the second power supply, with the gate terminal of the fourth MOS transistor being coupled to the first power supply, and the gate terminals of the first and third MOS transistors being coupled to the bias voltage junction point.

This circuit configuration provides a power integrated circuit with a reverse-voltage protection circuit and a bias-voltage generating circuit which is fully integrated, simple, compact and efficient in construction, and capable of operating at relatively high power and voltage levels.

BRIEF DESCRIPTION OF THE DRAWING

FIG. 1 is a simplified cross-sectional view of a prior-art power integrated circuit;

FIG. 1b is a simplified schematic drawing of the power integrated circuit shown in FIG. 1a;

FIG. 2a is a simplified schematic drawing of a prior-art reverse-voltage protection scheme for a portion of the power integrated circuit of FIGS. 1a and 1b;

FIG. 2b is a simplified circuit diagram equivalent circuit for the circuit shown in FIG. 2a;

FIG. 3b is a simplified cross-sectional view of part of a power integrated circuit incorporating the reverse-voltage protection circuit of FIG. 3a;

FIG. 4b is a simplified cross-sectional view of a power integrated circuit incorporating the circuit configuration of FIG. 4a.

Figure 3A:
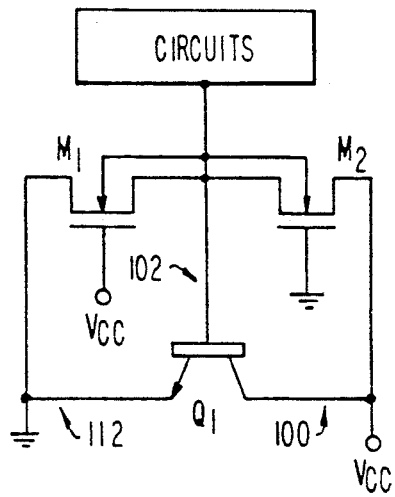
FIG. 3a is a simplified schematic diagram of a voltage protection circuit in accordance with the invention.

In the drawing, semiconductor zones and regions of like conductivity type are generally shown hatched in the same direction. Additionally, like reference numerals are generally used to identify like regions in different figures of the drawing. Furthermore, it should be noted that the figures are not drawn to scale, and that, in particular, dimensions in the vertical direction have been exaggerated for improved clarity.

DESCRIPTION OF THE PREFERRED EMBODIMENTS

FIG. 1a of the drawing shows a simplified cross-sectional view of a PIC device 10 of the general type having a substrate 100 of a first conductivity type (herein n-type) a first, surface-adjoining well 102 of a second conductivity type opposite to the first (herein p-type) and containing various low-power circuits, and a second, surface-adjoining well 104, also of p type conductivity, and spaced apart from the first well 102, with at least one power transistor (here a VDMOS transistor) being provided as least partly in well 104. The particular nature and configuration of the low-power circuits and the power transistor are not shown in FIG. 1a, as their precise configuration is not critical to the invention. A contact region 106 of p+conductivity type is provided in well 102 for coupling the circuits within that well to a power supply terminal (ground) and a similar region 108 is provided in well 104 for coupling the power transistor to ground through a resistor $R_L$. Finally, a contact region 110 is provided on the lower surface of the substrate 10 for connecting the substrate directly to a power supply terminal ($V_{cc}$). The p-n junctions between p-type wells 102 and 104, respectively, and the n-type substrate 100 are shown schematically by diodes $D_2$ and $D_1$.

A simplified schematic diagram of the device of FIG. 1a is shown in FIG. 1b. During normal operation, a positive voltage (typically in the range of 8 to 35 volts) is connected directly to the $V_{cc}$ terminal at the substrate, so that the diodes $D_1$ and $D_2$ are reverse biased to prevent unwanted and possibly damaging the current flow through the substrate-well junctions. However, during a reverse-voltage condition, as might typically occur due to an improper connection of battery cables in an automobile, a negative voltage will be applied to the substrate, and diodes $D_1$ and $D_2$ will become forward biased, thus permitting current flow as indicated schematically by arrows $I_1$ and $I_2$ in FIG. 1b. Although the current through diode $D_1$ (from the power transistor well) is limited by load resistor $R_L$, the current $I_2$ (through the circuit well 102) is not limited. Accordingly, large and potentially damaging currents can flow through this circuit path in the event of inadvertent reverse voltage application.

Figure 3B:
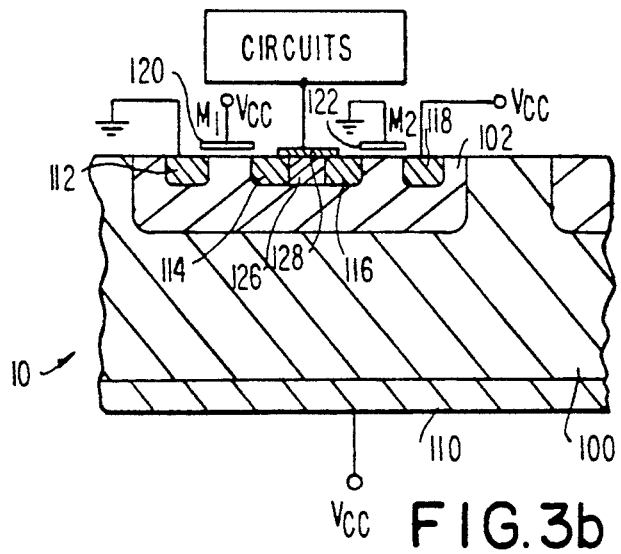

One known technique for overcoming this problem is shown in FIG. 2a, where the p-type well 102, instead of being connected directly to ground as in FIGS. 1a and 1b, is instead coupled to ground through a p-n junction, shown schematically in FIG. 2a as diode $D_3$. Such a diode may be simply formed by providing an n type zone 112 in the p-type well 102 as shown in FIG. 3b (to be described in further detail hereinafter). However, the disadvantage of this prior-art approach, as noted in the previously-cited IEEE publication, is that the two resulting back-to-back diodes $D_2$ and $D_3$, formed by n-type substrate 100, p-type well 102 and n-type zone 112, form a vertical parasitic transistor shown schematically in FIG. 2b as transistor $Q_1$.

The introduction of parasitic transistor $Q_1$ creates two problems. First, current flowing into p-type well 102 is amplified by transistor $Q_1$, causing large leakage currents from $V_{cc}$ to ground, which can damage the device. Second, the reverse breakdown voltage of the junction between well 102 and zone 112 is typically fairly low (about 7 volts), and thus not sufficient to sustain the level of reverse voltage protection needed in many applications.

In order to provide reverse-voltage protection in PIC devices while at the same time overcoming the disadvantages mentioned above, a circuit such as that shown in FIG. 3a may be used. In this circuit, two series-connected MOS switching transistor, $M_1$ and $M_2$, are connected across the two power supply terminals, with their common intermediate connection being connected to the base of vertical parasitic bipolar transistor $Q_1$. In order to relate the schematic diagram of FIG. 3a to the simplified partial cross-sectional view of FIG. 3b, reference numerals designating the three semiconductor regions 112, 102 and 100, forming, respectively, the emitter, base and collector of the transistor $Q_1$, are shown in FIG. 3a. In order to automatically shunt current to ground (and therefore away from the base of transistor $Q_1$) the gate electrodes of MOS transistors $M_1$ and $M_2$ are connected to $V_{cc}$ and ground, respectively. Thus, under normal (forward voltage) conditions, $V_{cc}$ will be above ground potential, $M_2$ will be "off" and $M_1$ will be "on" to provide a relatively low inpedance path for shunting current to ground and away from the base of transistor $Q_1$. Under reverse-voltage conditions, $V_{cc}$ will be below ground potential, transistor $M_1$ will be "off" and transistor $M_2$ will be "on", thus again shunting current away from the base of transistor $Q_1$ and reducing the adverse effects of the parasitic transistor. By shunting current away from the base of transistor $Q_1$ its beta is effectively reduced, thereby reducing its collector current and minimizing its impact on circuit operation. The circuit configuration shown in FIG. 3a is capable of reducing the beta of transistor $Q_1$ by a factor of between about 3 and 10, thus providing a substantial improvement in circuit performance.

A physical implementation of the circuit of FIG. 3a is shown in the simplified cross-sectional view of FIG. 3b. In FIG. 3b, the MOS transistors $M_1$ and $M_2$ are implemented by highly-doped n-type surface-adjoining zones 112, 114, 116 and 118, which form the source and drain regions of the two transistors. Gate electrodes for transistors $M_1$ and $M_2$ are shown in simplified fashion by electrodes 120 and 122, with the two transistors being connected together in series, and to well 102, by highly-doped p-type zone 126 and connection conductor 128.

While the circuit shown in FIGS. 3a and 3b provides basic reverse-voltage protection, PIC operation at moderately high voltages, such as the typical reverse voltage of $-12$ volts and typical forward voltage peaks of up to 35 volts encountered in automotive electronics will create a number of problems. More particularly, at forward voltages above about 15 volts, transistor $M_2$ will be susceptible to drain-to-source breakdown, while the junction between zone 112 and p-type well 102 will be in danger of breakdown at reverse voltage levels above about 7 volts. Additionally, at forward voltages of about 35 volts or higher there is a danger of gate-to-source breakdown in MOS transistor $M_1$.

In order to overcome these additional problems, related to increased operating and reverse voltage levels, a further embodiment of the invention incorporates a bias-voltage generating circuit used in combination with the reverse voltage protection circuit previously described. This circuit, shown in FIG. 4a, incorporates the reverse-voltage protection circuit of FIG. 3a in its lower portion and a bias-voltage generating circuit in its upper portion. In the simplified cross-sectional view of FIG. 4b, an implementation of the circuit of FIG. 4a is shown in which the bias-voltage generating circuit is fabricated in a p-type surface-adjoining well adjacent to (but spaced apart from) the well containing the reverse-voltage protection circuit.

Figure 4A:
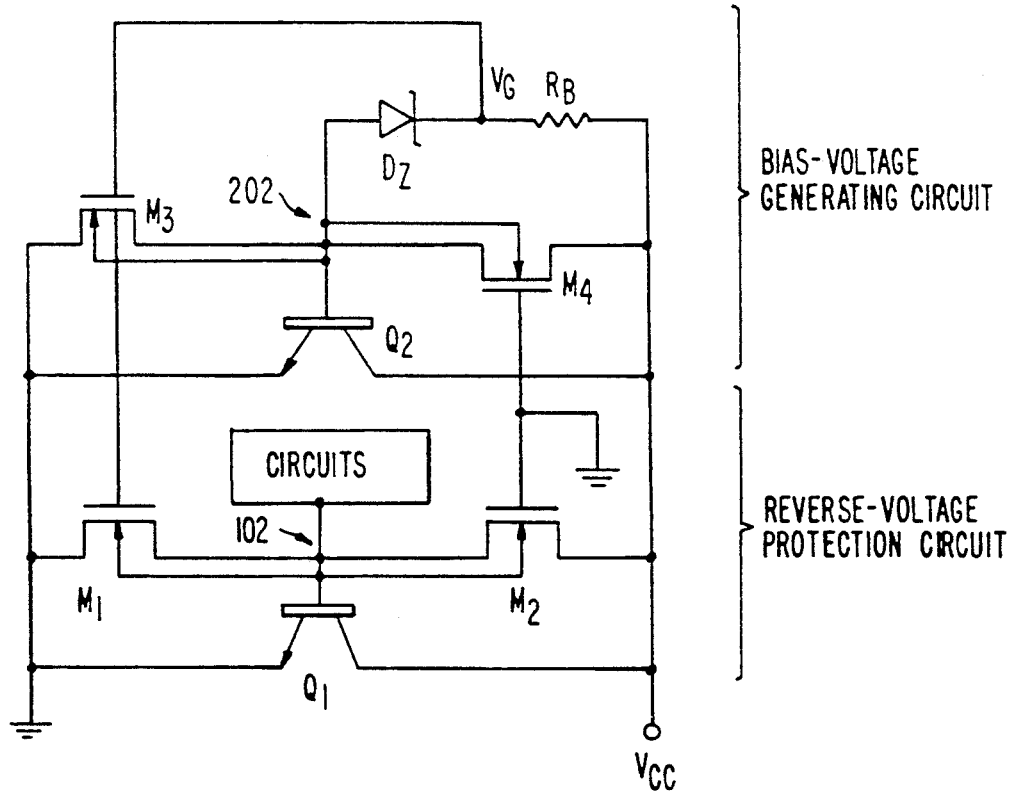
FIG. 4a is a simplified circuit diagram of the reverse-voltage protection circuit of FIG. 3a incorporating a bias-voltage generating circuit in accordance with the invention.

In the embodiment shown in FIG. 4a, the reverse-voltage protection circuit in the lower portion of the Figure is similar to the circuit shown in FIG. 3a, except that the gate electrode of transistor $M_1$, instead of being connected directly to $V_{cc}$, is instead connected to a terminal $V_G$ of the bias-voltage generating circuit. In the bias-voltage generating circuit, bipolar transistor $Q_2$ represents the vertical parasitic transistor formed in like manner to that of transistor $Q_1$, but in p-type well 202 of FIG. 4b. This circuit includes two further MOS transistors, $M_3$ and $M_4$, connected in series between the power supply terminals ($V_{cc}$ and ground), with the common junction between the two series-connected MOS transistors being connected to the base of the parasitic vertical transistor $Q_2$. In order to generate the bias voltage, a resistor $R_B$ is connected from $V_{cc}$ to bias voltage terminal $V_G$. The bias-voltage generating circuit is completed by a zener diode $D_Z$ connected from terminal $V_G$ to the base of transistor $Q_2$, which corresponds to the p-type well 202. The bias voltage terminal $V_G$ is connected to the gate terminals of transistors $M_1$ and $M_3$ to provide a bias voltage for these transistors with the zener diode $D_Z$ being fabricated in such a manner as to provide a zener bias voltage of about 15 volts.

By connecting the gates of transistors $M_1$ and $M_3$ to the bias voltage terminal $V_G$ of the bias-voltage generating circuit, gate-to-source breakdown in these transistors will be avoided at higher values of $V_{cc}$. When $V_{cc}$ is less than the zener voltage (here about 15 volts) the voltage at terminal $V_G$ is substantially equal to $V_{cc}$ for optimum performance, but when $V_{cc}$ exceeds the zener voltage, $V_G$ is clamped to the zener voltage by zener diode $D_Z$, so that the risk of gate-to-source breakdown in transistors $M_1$ and $M_3$ is avoided.

Figure 4B:
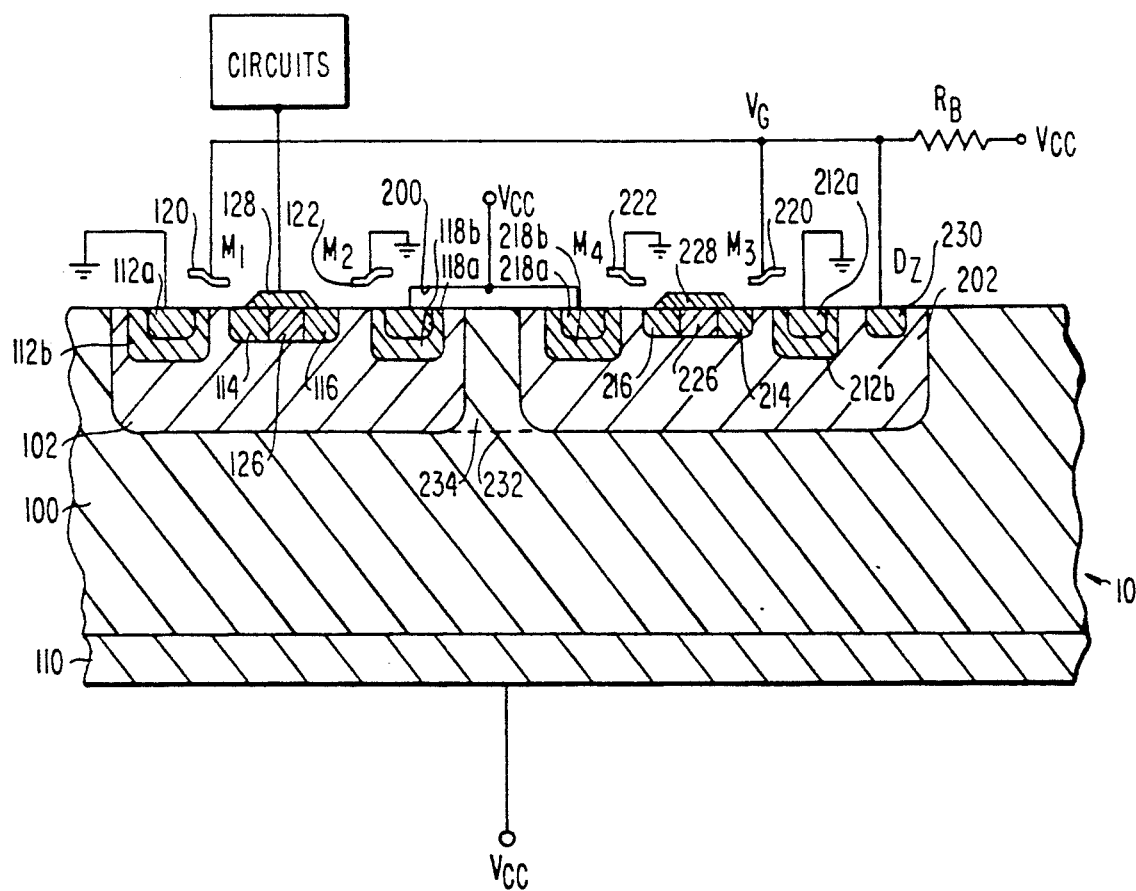

FIG. 4b shows a simplified cross-sectional view of a structure in accordance with the circuit of FIG. 4a which offers additional protection against component breakdown at higher operating voltages.

In FIG. 4b, transistors $M_3$ and $M_4$ are configured in the same manner as transistors $M_1$ and $M_2$, and corresponding structural features have accordingly been given reference numerals with the last two digits corresponding to the analogous features of transistors $M_1$ and $M_2$. Transistors $M_1$–$M_4$ in FIG. 4b also correspond to the configuration of transistors $M_1$ and $M_2$ as previously described with reference to FIG. 3b (and so will not be further described), with one important exception. In FIG. 4b, the highly-doped n-type zones 112 and 118 have been replaced by similar zones 112a and 118a in p-type well 102 (and zones 212a and 218a in p-type well 202) which are surrounded by less highly-doped n-type drift regions 112b and 118b (212b and 218b in p-type well 202). The purpose of these added drift regions in FIG. 4b is to raise the drain-to-source breakdown voltage of MOS transistor $M_2$ and increase the collector-to-base breakdown voltage of bipolar transistor $Q_1$.

In an alternative configuration, p-type wells 102 and 202 may be integrally formed as a single well. This alternative is illustrated by the dashed line 232 in FIG. 4b, which represents the contour of a single well. In this case the surface-adjoining region 234 above the dashed line 232, instead of being n-type, would be homogenous with the p-type wells 102 and 202.

If a single well is used, a further simplification can be achieved by using only a single pair of MOS transistors as shown in FIG. 3a, since there is now only a single vertical bipolar parasitic transistor, again as shown in FIG. 3a.

In FIG. 4b, zener diode $D_Z$ is implemented by adding a highly doped n-type zone 230, and power supply voltage $V_{cc}$ is supplied to zones 118a and 218a of MOS transistors $M_2$ and $M_4$ by a conductor 200. Finally, the resistor $R_B$ is shown for simplicity in this embodiment as an externally-provided component, but it may also be integrated into the PIC.

Thus, by the use of a bias-voltage generating circuit as shown in FIG. 4a in a structure containing additional drift regions as shown in FIG. 4b, a device configuration is achieved which overcomes all of the previously-mentioned problems associated with relatively high voltage operation of the reverse-voltage protection circuit.

While the invention has been particularly shown and described with reference to several preferred embodiments thereof, it will be understood by those skilled in the art that various changes in form and detail may be made without departing from the spirit or scope of the invention.

I claim:

1. A power integrated circuit having a substrate of a first conductivity type, a first, surface-adjoining well of a second conductivity type opposite to the first, at least one low-power circuit being provided in said first well, a second, surface-adjoining well of said second conductivity type and spaced apart from aid first well, at least one power transistor being provided at least partly in said second well, characterized in that said power integrated circuit comprises a reverse-voltage protection circuit, which comprises:
- a p-n junction for coupling said first well to a first power supply terminal, said p-n junction and a further p-n junction between said first well and said substrate together forming a bipolar transistor having a base region and two main regions defining a major current path, said substrate being coupled to a second power supply terminal;
- a first MOS transistor in said first well and having a main current path coupled between said base region and a first of said two main regions of said bipolar transistor, and a gate terminal coupled to said second power supply terminal; and
- a second MOS transistor in said first well and having a main current path coupled between said base region and a second of said two main regions of said bipolar transistor, and a gate terminal coupled to said first power supply terminal.

2. A power integrated circuit as in claim 1, wherein the gate terminal of said first MOS transistor is connected directly to said second supply terminal.

3. A power integrated circuit as in claim 1, further comprising a third surface-adjoining well of said second conductivity type and spaced apart from said first and second wells, a bias-voltage generating circuit at least partly formed in said third well and comprising a third MOS transistor, a fourth MOS transistor, a resistor, and a zener diode, first and second regions of said first conductivity type in said third well for coupling said third well to said first and second power supply terminals, respectively, said first region, said third well and said substrate together forming a further bipolar transistor, said third well forming the base region of said further bipolar transistor, said resistor being coupled from said second power supply terminal to a bias voltage terminal, said zener diode being coupled from said bias voltage terminal to said third well, said third MOS transistor having a gate terminal and a main current path coupled between said third well and said first power supply, said fourth MOS transistor having a gate terminal and a main current path coupled between said third well and said second power supply, the gate terminal of said fourth MOS transistor being coupled to said first power supply, and the gate terminals of said first and third MOS transistors being coupled to said bias voltage terminal.

4. A power integrated circuit as in claim 3, wherein each of said first and second regions of said first conductivity type in said third well comprise a surface-adjoining drift region with a surface-adjoining region provided therein, said surface-adjoining region being more highly doped than said surface-adjoining drift region, and wherein each of said first and second MOS transistors comprises a surface-adjoining drift region in its main current path, with a surface-adjoining region provided therein, said surface-adjoining region of said first and second MOS transistors being more highly doped than said surface adjoining drift region of said first and second MOS transistors.

5. A power integrated circuit as in claim 3, wherein said first and third surface-adjoining wells are integrally formed as a single well containing said at least one low-power circuit and at least part of said bias voltage generating circuit.

6. A power integrated circuit as in claim 4, wherein said first and third surface-adjoining wells are integrally formed as a single well containing said at least one low-power circuit and at least part of said bias voltage generating circuit.

* * * * *